(12) United States Patent
Armacost et al.

(10) Patent No.: US 6,750,113 B2
(45) Date of Patent: Jun. 15, 2004

(54) METAL-INSULATOR-METAL CAPACITOR IN COPPER

(75) Inventors: Michael D. Armacost, San Jose, CA (US); Andreas K. Augustin, Munich (DE); Gerald R. Friese, Fishkill, NY (US); John E. Heidenreich, III, Yorktown Heights, NY (US); Gary R. Hueckel, Putnam Valley, NY (US); Kenneth J. Stein, Sandy Hook, CT (US)

(73) Assignees: International Business Machines Corporation, Armonk, NY (US); Infineon Technologies, AG, Munich (DE)

( * ) Notice: Subject to any disclaimer, the term of this patent is extended or adjusted under 35 U.S.C. 154(b) by 696 days.

(21) Appl. No.: 09/764,832

(22) Filed: Jan. 17, 2001

(65) Prior Publication Data

US 2002/0094656 A1 Jul. 18, 2002

(51) Int. Cl.⁷ .............................................. H01L 21/20
(52) U.S. Cl. ...................... 438/396; 438/393; 438/239
(58) Field of Search .............................. 438/393, 396, 438/239, 250, 253

(56) References Cited

U.S. PATENT DOCUMENTS

| | | | | |
|---|---|---|---|---|
| 5,624,864 A | * | 4/1997 | Arita et al. ..................... | 438/3 |
| 5,627,391 A | * | 5/1997 | Shimada et al. ............. | 257/310 |
| 5,633,181 A | * | 5/1997 | Hayashi ....................... | 438/234 |
| 5,717,233 A | * | 2/1998 | Fujii et al. .................... | 257/295 |
| 5,929,475 A | * | 7/1999 | Uemoto et al. .............. | 257/295 |
| 6,225,156 B1 | * | 5/2001 | Cuchiaro et al. ............ | 438/240 |
| 6,236,101 B1 | * | 5/2001 | Erdeljac et al. .............. | 257/531 |
| 6,239,462 B1 | * | 5/2001 | Nakao et al. ................. | 257/310 |
| 6,294,805 B1 | * | 9/2001 | Jung ............................ | 257/295 |
| 6,404,003 B1 | * | 6/2002 | McMillan et al. ........... | 257/306 |
| 6,465,260 B1 | * | 10/2002 | Hong et al. ..................... | 438/3 |
| 2001/0012659 A1 | * | 8/2001 | Sashida et al. .............. | 438/250 |
| 2002/0160577 A1 | * | 10/2002 | Hosoda et al. ............... | 438/396 |

* cited by examiner

Primary Examiner—Tom Thomas
Assistant Examiner—N. Drew Richards
(74) Attorney, Agent, or Firm—Ira D. Blecker

(57) ABSTRACT

A parallel plate capacitor in copper technology is formed in an area that has no copper below it (within 0.3 µm) with a bottom etch stop layer, a composite bottom plate having an aluminum layer below a TiN layer, an oxide capacitor dielectric, and a top plate of TiN; in a process that involves etching the top plate to leave a capacitor area, etching the bottom plate to a larger bottom area having a margin on all sides; depositing an interlayer dielectric having a higher material quality below the top surface of the capacitor top plate; opening contact apertures to the top and bottom plates and to lower interconnect to a two step process that partially opens a nitride cap layer on the lower interconnect and the top plate while penetrating the nitride cap layer above the bottom plate, then cutting through the capacitor dielectric and finishing the penetration of the nitride cap layer.

5 Claims, 8 Drawing Sheets

METAL-INSULATOR-METAL CAPACITOR IN COPPER

FIELD OF THE INVENTION

The field of the invention is integrated circuits with copper interconnect.

BACKGROUND OF THE INVENTION

In the course of forming the metallization of an integrated circuit, it is sometimes necessary to construct parallel plate capacitors. In the field of aluminum interconnections, such processes are well developed.

In the field of copper interconnect, however, development of a suitable process has proved to be unexpectedly difficult.

The potential hillocks and gouges in a copper metal surface can cause thinning and discontinuities in the active dielectric or in the capacitor plates, leading to early wear out and potential breakdown.

SUMMARY OF THE INVENTION

The invention relates to a parallel plate capacitor having a lower plate that does not include a layer of copper and does not extend over a lower copper interconnect in the area of the capacitor proper.

An optional feature of the invention is a composite lower plate having a material of lower resistivity, such as aluminum, covered by a top liner of material having a higher resistivity.

Another feature of the invention is the provision of a capacitor top plate that does not include copper and is smaller on all sides than the bottom plate.

Another feature of the invention is the deposition of an interlayer dielectric surrounding the capacitor that has a high material quality at least in the portion of the dielectric that is on the same level as the capacitor.

Another feature of the invention is the coverage of the capacitor stack by a material that provides lower etch rates during the etch of the interlayer dielectric to form contacts. The thickness of this material might be different for top and bottom plates.

Another feature of the invention is a multiple step process for opening contact apertures to the capacitor plates, in which a first step etches only partially through cap layers on the top plate and on lower interconnects while etching all the way through the cap above the bottom plate, after which the remaining portion of the cap layers is etched through.

Another feature is the layer of dielectric (i.e. ILD material) that is located between the hard dielectric cap on top of the underlying Cu metallization and the bottom plate of the capacitor. This layer protects that hard dielectric cap and the Cu of the underlying level during the formation of the bottom plate.

DESCRIPTION OF THE PREFERRED EMBODIMENT

Figure 1:
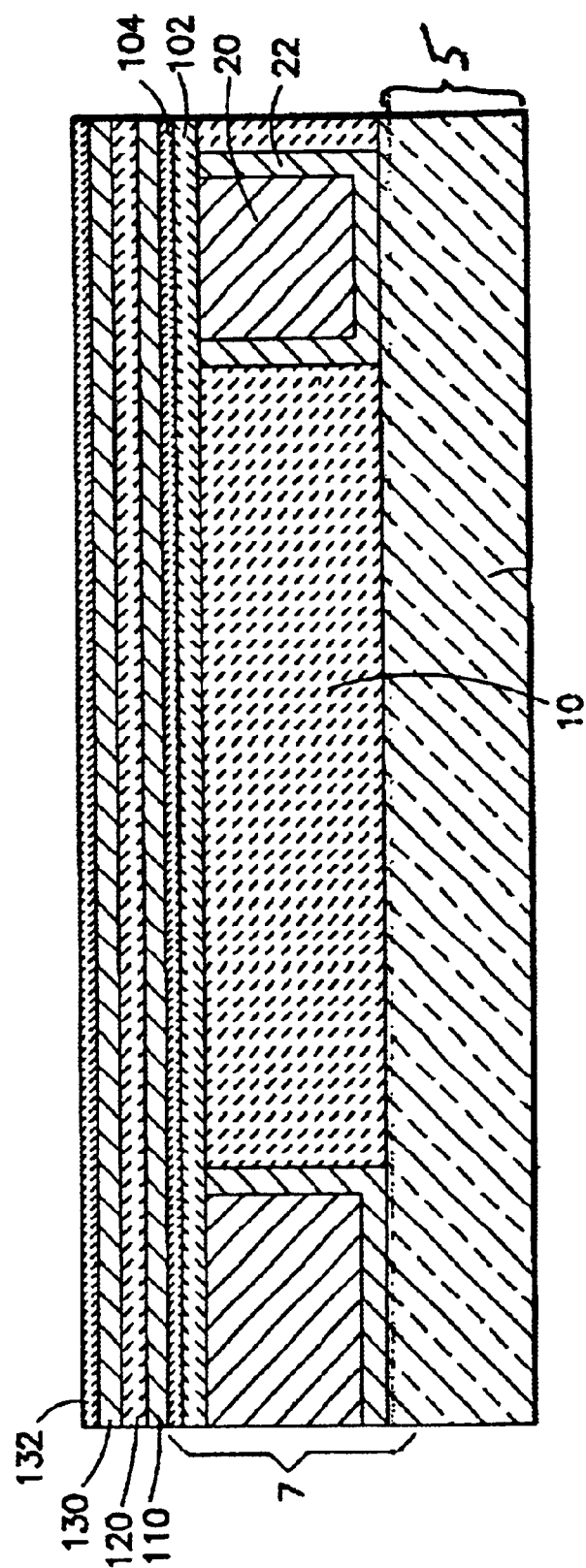
FIG. 1 shows in cross section an area of an integrated circuit that will include a capacitor according to the invention.

Referring now to FIG. 1, there is shown in cross section a portion of an integrated circuit. At the bottom of the Figure, the area denoted with bracket 5 represents schematically a silicon substrate, transistors and lower level interconnects. The term lower level interconnects will be used for convenience to represent poly interconnects, and all other levels up to the bottom of the capacitor. It includes metal (copper) members 20 in this Figure.

An initial capacitor stack includes first (nitride $Si_3N_4$) cap layer 102 (advantageously part of the regular metallization), sacrificial (oxide $SiO_2$) layer 104, bottom plate layer 110, capacitor dielectric layer 120, top plate layer 130 and second cap layer 132. Illustratively, in a 0.28 µm ground rule (referring to the minimum dimension of the line level) process, first cap layer 102 is 50 nm of nitride, oxide 104 is 50 nm of high quality oxide, bottom plate 110 comprises 35 nm of Al, 5 nm of Ti and 50 nm of TiN, dielectric 120 is 50 nm of high quality oxide, top plate 130 is 50 nm of TiN and second cap layer 132 is 40 nm of nitride. The capacitor stack could also be built up by different materials and/or different thicknesses of the layers.

The capacitor will be formed in the area between lower level interconnect members 20. It is known in the art that copper is difficult to polish, but it has unexpectedly been found that even when irregularities in the copper surface are comparable to those in aluminum top surfaces, (50–75 nm) these irregularities can lead to early reliability failure.

Accordingly, no part of the capacitor per se (indicated by arrow 152 in FIG. 2) can be placed above a copper lower level interconnect that is less than about 0.3 µm below the bottom plate of the capacitor. Bracket 7 in FIG. 1 represents this smallest allowable vertical distance. One skilled in the art would ordinarily think to place at least the contact portion of the bottom plate directly over a lower member and preferably to make the plates of copper.

Illustratively, the present invention employs plates made of the liner material of the copper interconnects. Illustratively, the liner material is TiN, but any other compatible liner material may be used that meets the overall process thermal budget, metallic contamination specifications, etc.

Figure 2:
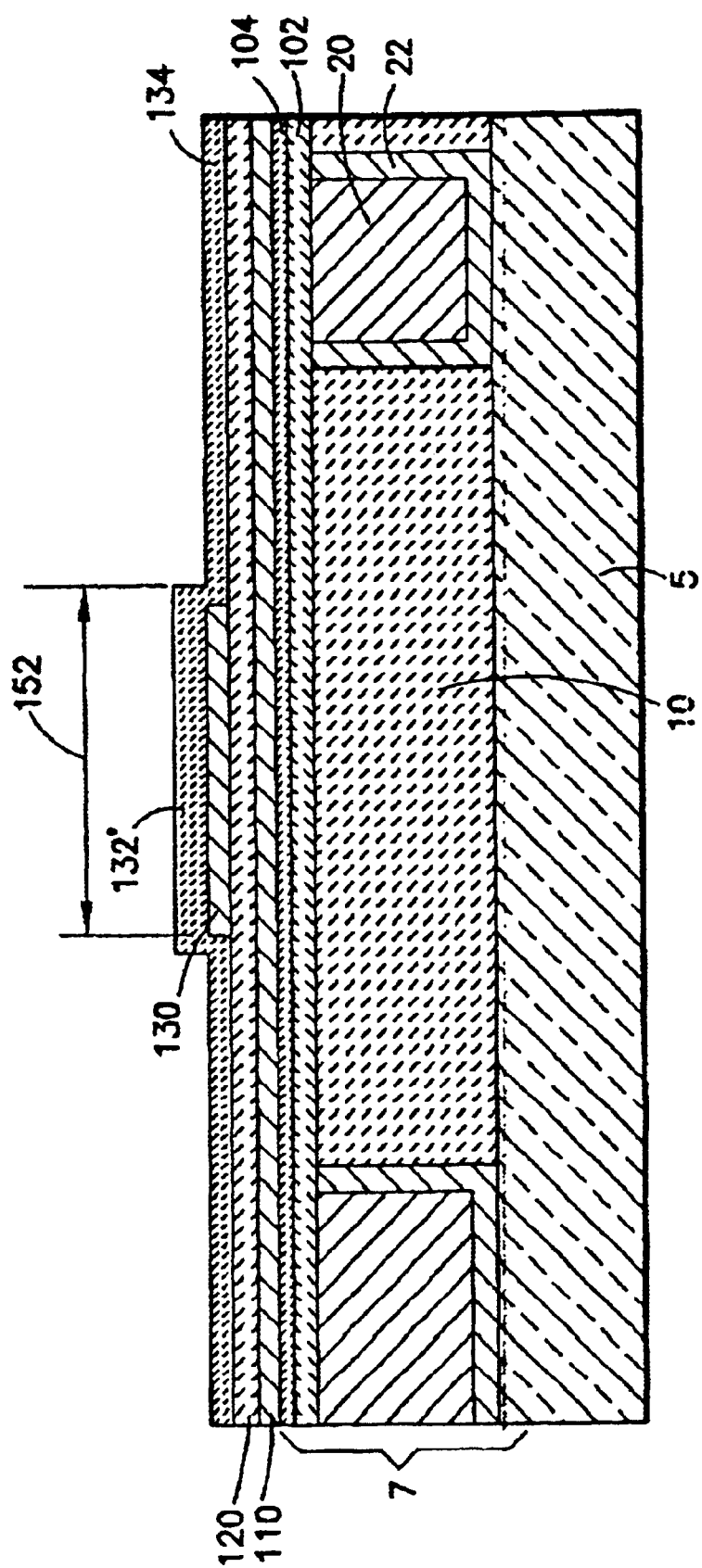
FIGS. 2–8 show the same area at later stages in the process.

In FIG. 2, the result of the first etch step and deposition is illustrated. An area denoted with arrow 152 has been left after the first etch ($Cl_2/BCl_3$ chemistry), which defined the capacitor top plate and stopped on the capacitor dielectric 120. This area will be referred to as the capacitor area (which may be rectangular instead of square) and is the area that defines the actual capacitor. A second deposition of 40 nm of nitride has been performed that leaves cap layer 134 outside the capacitor area and layer 132' above the capacitor top plate 152. The significance of the increased thickness of 132' will be explained below.

Figure 3:
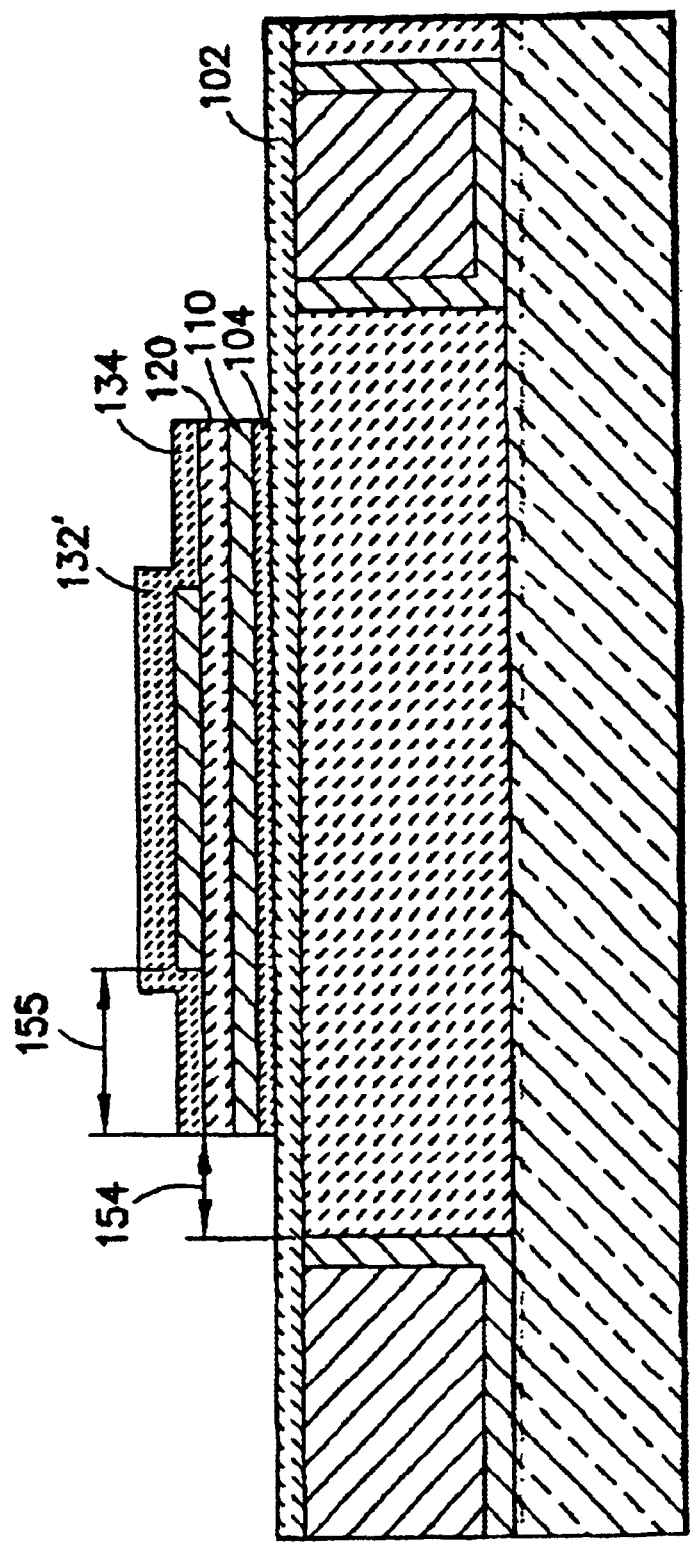

FIG. 3 illustrates the result of the bottom plate etch, in which all of layers 104, 110, 120 and 134 are etched in $BCl_3/Cl_2$ chemistry. The etch is designed to stop in layer 104, which etches substantially slower than nitride layer 102.

A distance denoted by arrow 154 represents the closest allowable horizontal distance between the vertical edge of the bottom plate and a conductor (lower interconnect member 20) in case the capacitor has its electrical connections to the level above. This distance will be referred to as the capacitor closest approach distance. There can be a potential leakage path from top plate 152 down to bottom plate 110 caused by plasma damage of dielectric 120 from the top plate etch.

A distance denoted by arrow 155 represents the closest allowable distance between the vertical edge of the top plate and the corresponding edge of the bottom plate. This distance will be referred to as the leakage closest approach distance. The distance is required for control of leakage between the plates and is 1.0 μm in the preferred embodiment. The extent of the bottom plate may be increased on one or more sides (greater than the leakage closest approach distance) in order to accommodate areas for a contact to the bottom plate.

Figure 4:
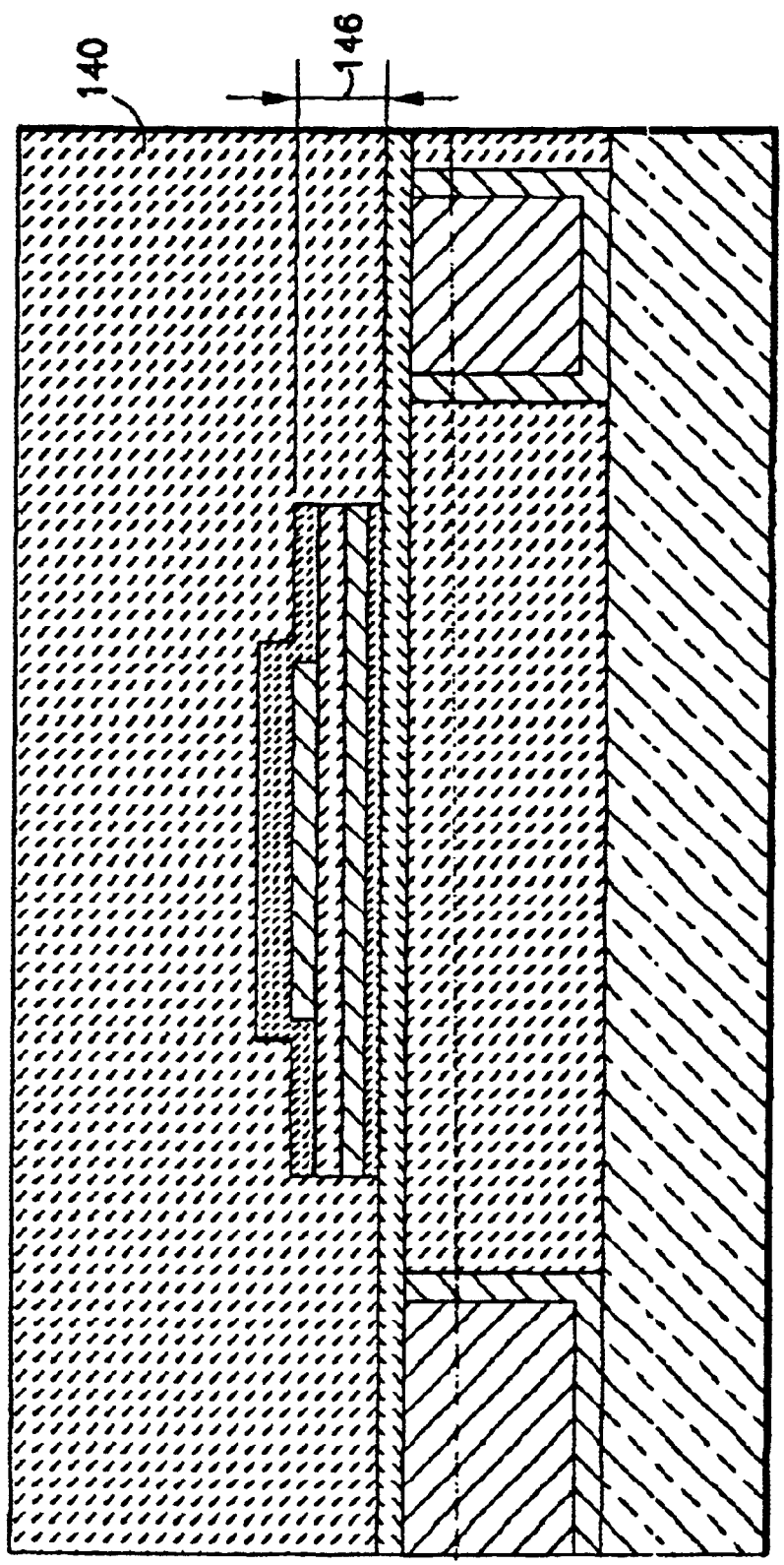

FIG. 4 illustrates the result of depositing interlayer dielectric 140 (oxide) around the set of capacitor plates. The lower portion of interlayer dielectric 140, denoted by bracket 146 and illustratively 300 nm, is deposited in such a manner that it eliminates voids that could form a leakage path (illustratively deposited at a lower rate. The term void is used to mean an opening of 20 nm or more to distinguish it from the normal porosity of oxide. In order to be able to resume the Cu dual damascene processing a planarizing process such as CMP is applied to take off the generated topography.

Figure 5:
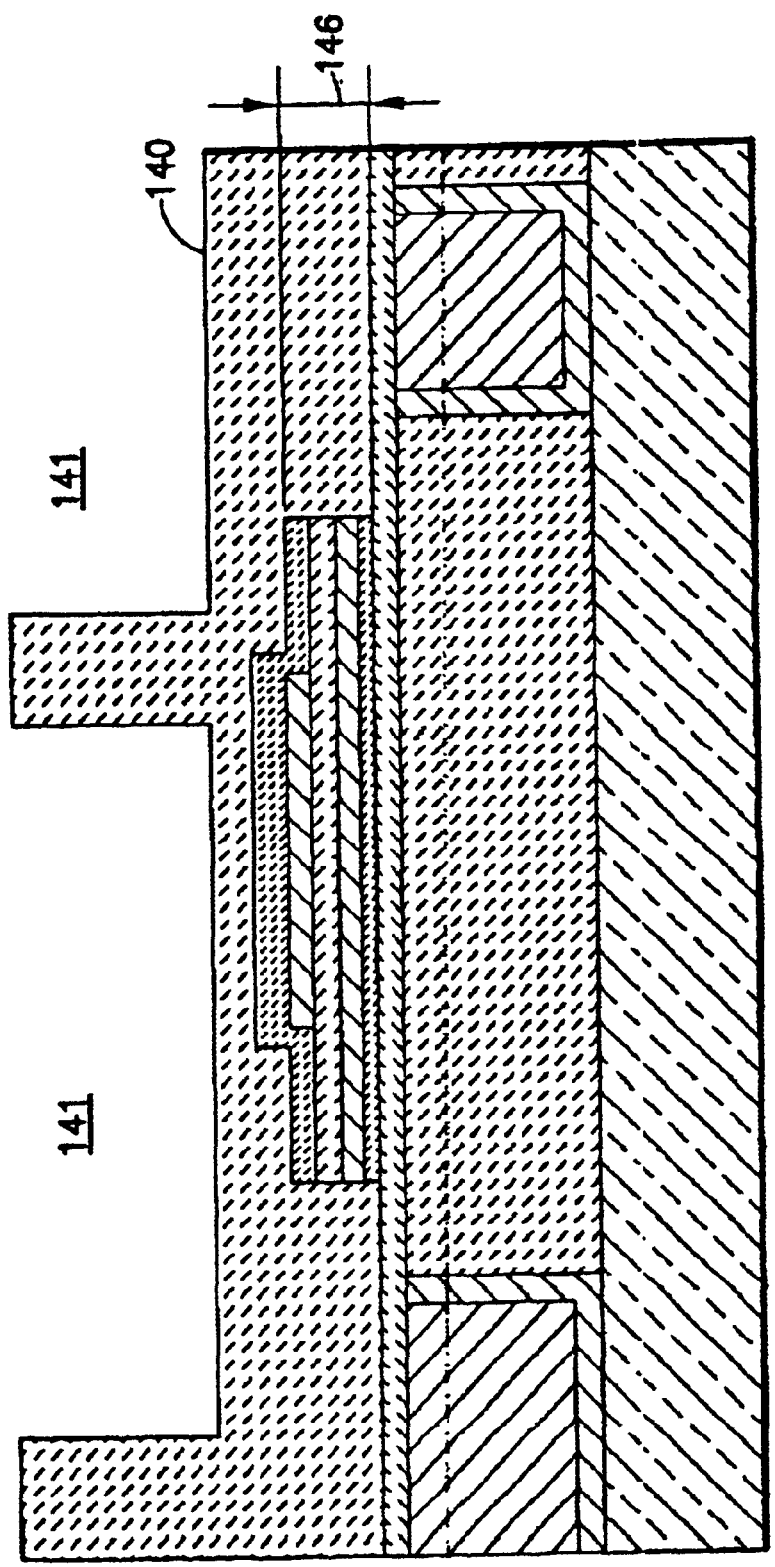

FIG. 5 illustrates the result of etching a set of metal lines 141 into oxide 140. In the illustrative example, the interconnects are used in a dual-damascene scheme. This is not essential and other approaches may be used.

Figure 6:
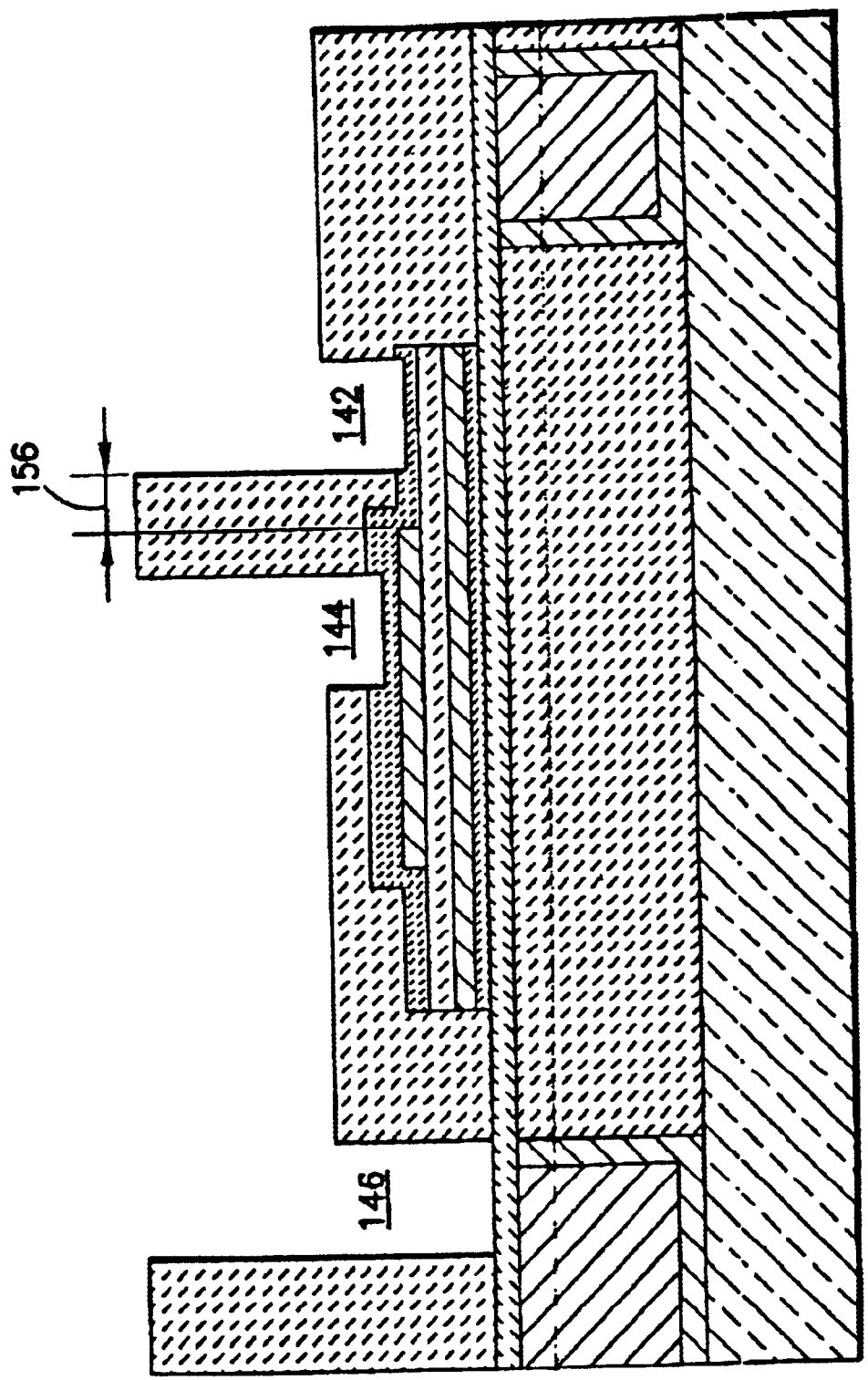

FIG. 6 illustrates the result of etching the vias—142 on the right, stopping on oxide 120 and 144 and 146 stopping part way through the nitride layers. Both layer 132' and 102 should be thick enough to give a reasonable margin to prevent etching through to the layer beneath. The purpose of this partial etching is to protect copper 20 from the oxide etchant to be used in the next step and from the subsequent resist strip process.

The distance labeled 156 represents the closest allowable approach between the top plate and the nearest electrode, illustratively 0.56 μm. The leakage path in question is from the lower right corner of top plate 130 through dielectric 120, damaged by the plasma etch.

Figure 7:
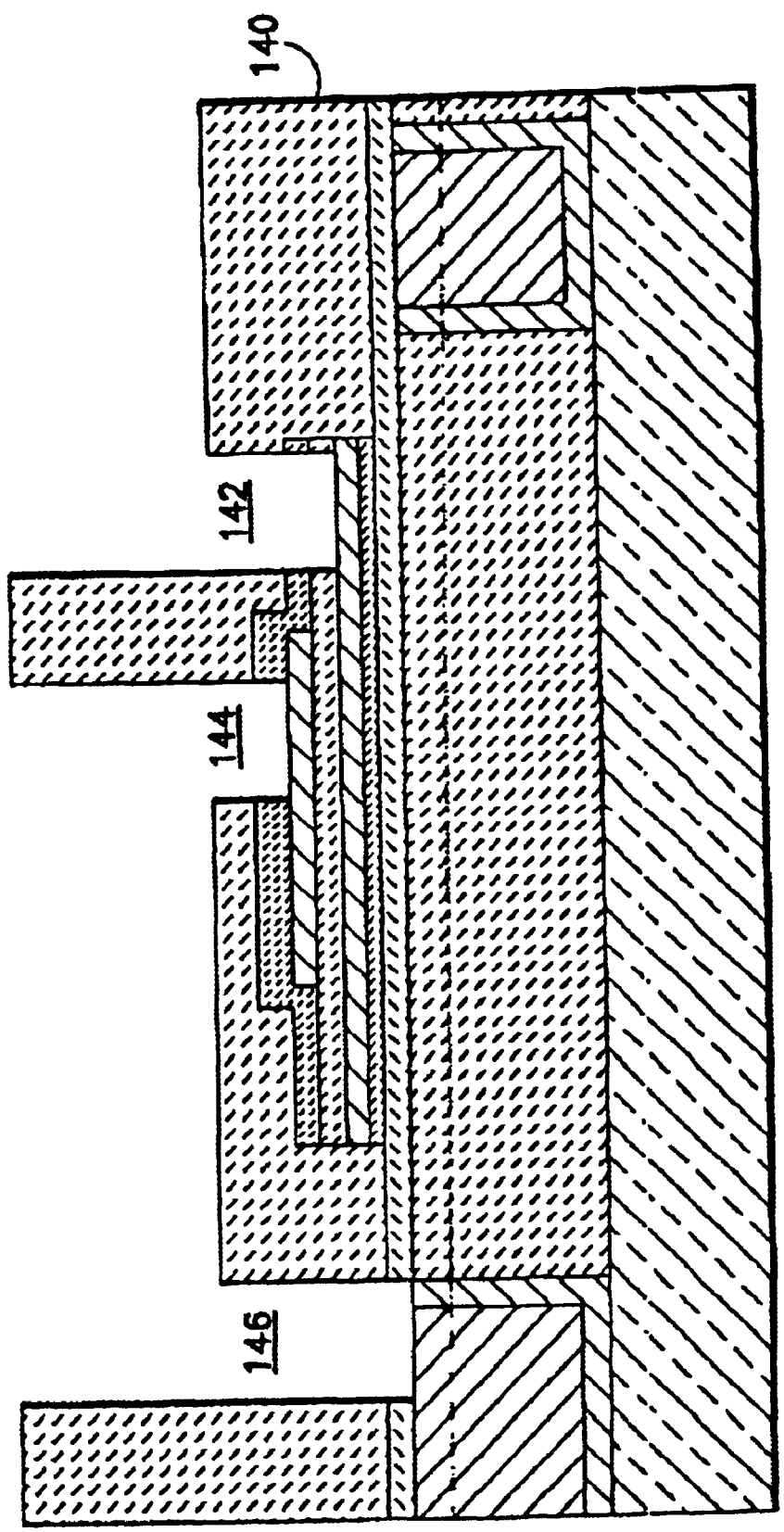

FIG. 7 illustrates the result of stripping the remaining nitride in apertures 144 and 146, exposing copper in aperture 146 and TiN in apertures 144 and 142. The via etch process has to be such that in no case all of the TiN at the bottom of the via is removed.

Optionally, the steps shown in FIGS. 6 and 7 could be combined, with a single etch step using $CHF_3/O_2$ chemistry etching all the way through nitride layers 132' and 102, stopping on the top and bottom plates. It should be noted that, in this process, copper is not exposed until the step of stripping the remainder of the nitride cap 134-132'.

Figure 8:
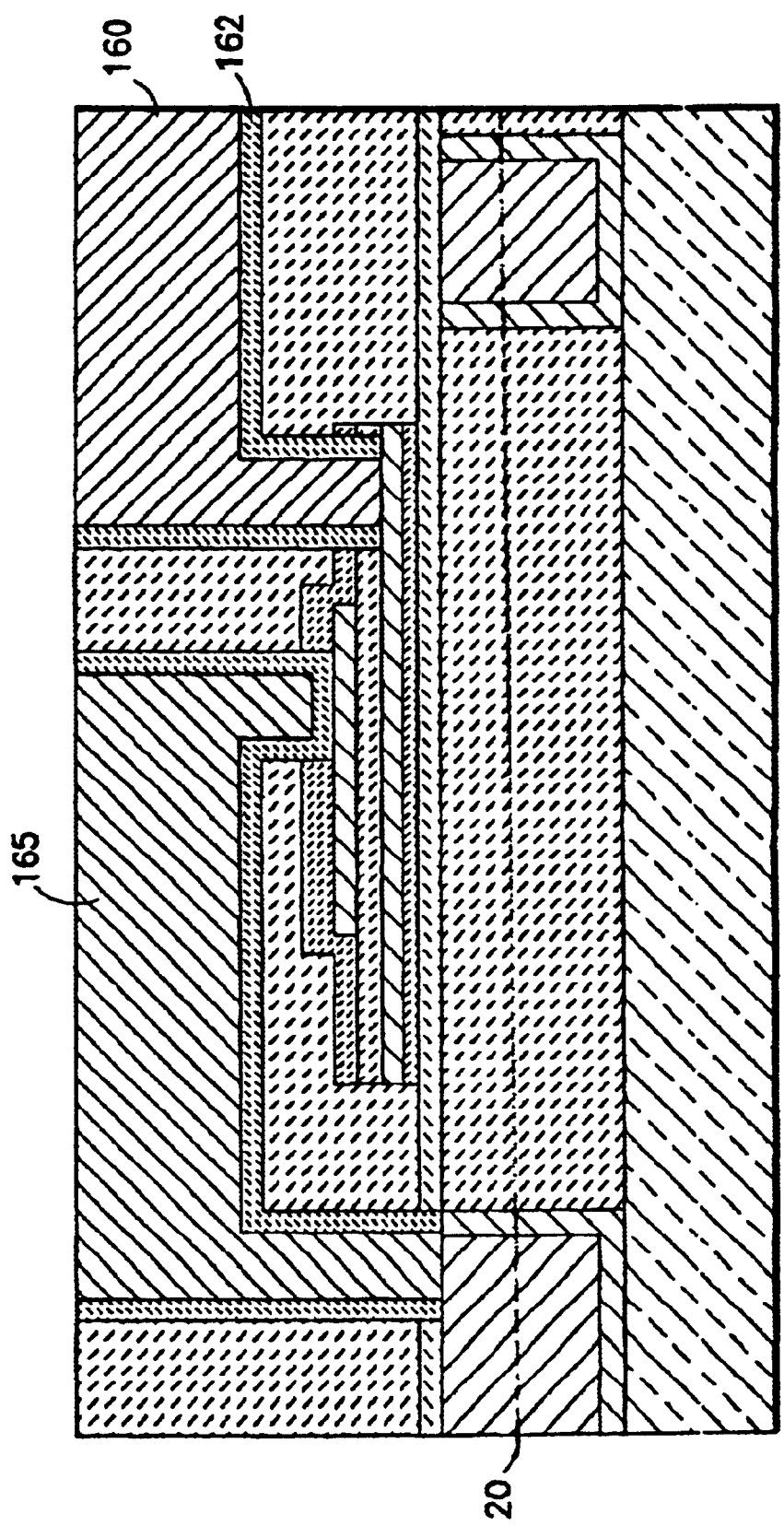

FIG. 8 illustrates the result of depositing a conventional TiN liner 162 and copper capacitor interconnect members 160 and 165.

On the left of the Figure, the connection between lower level interconnect member 20 and upper level (and capacitor) interconnect member 165 is conventional in copper technology.

The result is that the contacts to the capacitor plates are from above, not from below, and that in both cases, the contact is between layers of TiN and TaN/Ta. The amount of penetration into the TiN will depend on manufacturing tolerances. So long as good contact is made, no particular value is required.

The capacitor bottom plate is a composite structure in order to reduce the resistance to charging and discharging. The top TIN has a resistivity of about 55 ohms/square, which would provide an RC time constant that would be too large for some purposes. Al has a resistivity of about 2 ohms/square, so that the use of an Al layer to provide conductive together with a TIN layer as a barrier may be attractive. Optionally, a thicker TiN bottom plate (with no Al) having a resistivity of about 40 ohms/square could be used. A chip designer will have to make a judgment call as to whether the extra expense is required for a particular circuit.

Optionally, if the structure is so high that it presents difficulties in maintaining planarity, a recess can be etched in the interlayer dielectric and the lower plate formed in the recess.

Further, the capacitor may be at the highest level of interconnect, so that it is not necessary to planarize the insulator 140. Also, a different material, such as aluminum, could be used to make contact with the capacitor. Aluminum is often used as the material that makes contact with the external chip terminals.

Dimensions have been listed for illustrative purposes only and those skilled in the art will readily be able to adapt the example given to their own requirements. For example, the minimum distances to control leakage will depend on both the resistance of the materials along the relevant path and the amount of leakage that is tolerable in a particular circuit.

While the invention has been described in terms of a single preferred embodiment, those skilled in the art will recognize that the invention can be practiced in various versions within the spirit and scope of the following claims.

We claim:

1. A method of making a parallel plate capacitor in an integrated circuit employing copper interconnects, comprising the steps of:

forming devices and lower level interconnects, at least some of which are formed from copper, of said integrated circuit, including a set of top lower level interconnects;

forming an initial capacitor stack comprising a first cap layer having a first cap thickness, a conductive bottom plate layer disposed over said first cap layer, a capacitor dielectric layer disposed over said conductive bottom plate layer, a conductive top plate layer disposed over said capacitor dielectric layer, and a second cap layer having a second cap thickness disposed over said conductive top plate layer;

etching said second cap layer and said top plate layer, stopping on said capacitor dielectric layer, to form a capacitor top plate covered by said second cap layer, said capacitor top plate being contained within a capacitor area that is offset from a closest one of said set of top lower level interconnects by at least a minimum offset distance;

forming a third cap layer having a third cap thickness, whereby exposed portions of said capacitor dielectric layer are covered by said third cap layer and said conductive top plate is covered by a top plate cap layer having a top plate cap thickness substantially equal to the sum of said second and third cap thicknesses;

etching said third cap layer, said capacitor dielectric layer and said bottom plate layer, thereby forming a capacitor bottom plate covering said capacitor area and extending past said capacitor top plate on all sides, whereby all edges of said capacitor bottom plate are offset laterally from corresponding edges of said capacitor top plate by at least a top plate offset distance;

depositing a layer of interlayer dielectric;

forming a set of via apertures in said interlayer dielectric, stopping on said first and third cap layers;

removing all of said third cap layer in a bottom plate contact area above said bottom plate and outside said top plate and removing only a portion of said third cap layer above said top plate in a top plate contact area, leaving a remaining thickness of said third cap layer in said top plate contact area;

removing said capacitor dielectric in said bottom plate contact area;

removing all of said remaining thickness of said third cap layer in said top plate contact area; and forming capacitor interconnect members of a set of upper level interconnects in said top plate contact area and said bottom plate contact area.

2. A method according to claim 1, in which said bottom plate layer is a composite layer comprising a lower highly conductive layer and an upper conductive barrier layer and said step of removing said capacitor dielectric in said bottom plate contact area penetrates only said upper conductive barrier layer.

3. A method according to claim 1, in which a liner material is deposited in said top plate contact area and said bottom plate contact area; and a layer of copper is deposited above said liner material and patterned to form said set of upper level interconnects.

4. A method according to claim 1, in which:

said step of forming a set of via apertures in said interlayer dielectric includes simultaneously forming via apertures for said set of upper level interconnects;

said step of removing only a portion of said third cap layer above said top plate includes simultaneously removing only a portion of said third cap layer in said via apertures for said set of upper level interconnects;

said step of removing all of said remaining thickness of said third cap layer in said top plate contact area includes simultaneously removing all of said remaining thickness of said third cap layer in said via apertures for said set of upper level interconnects; and said step of forming capacitor interconnect members of a set of upper level interconnects in said top plate contact area and said bottom plate contact area includes simultaneously forming capacitor interconnect members for said set of upper level interconnects.

5. A method according to claim 1, in which said capacitor interconnect members are aluminum.

* * * * *